(12) United States Patent
Kitaguchi

(10) Patent No.: US 6,946,705 B2
(45) Date of Patent: Sep. 20, 2005

(54) LATERAL SHORT-CHANNEL DMOS, METHOD OF MANUFACTURING THE SAME, AND SEMICONDUCTOR DEVICE

(75) Inventor: Makoto Kitaguchi, Tachikawa (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/491,140

(22) PCT Filed: Sep. 18, 2003

(86) PCT No.: PCT/JP03/11874

§ 371 (c)(1),
(2), (4) Date: Mar. 29, 2004

(87) PCT Pub. No.: WO2005/029590

PCT Pub. Date: Mar. 31, 2005

(65) Prior Publication Data

US 2005/0062125 A1 Mar. 24, 2005

(51) Int. Cl.7 .......................... H01L 29/76; H01L 21/336
(52) U.S. Cl. ........................................ 257/335; 438/286
(58) Field of Search ................................. 257/492, 493, 257/335, 342, 343, E29.066, E29.256, E29.261, E21.373, E21.417, E21.424, E21.427; 438/286

(56) References Cited

U.S. PATENT DOCUMENTS

| | | | |
|---|---|---|---|
| 4,866,495 A | * | 9/1989 | Kinzer .................... 257/337 |
| 5,023,678 A | | 6/1991 | Kinzer |
| 5,369,045 A | | 11/1994 | Ng et al. |
| 6,424,005 B1 | * | 7/2002 | Tsai et al. ................ 257/335 |
| 6,593,621 B2 | * | 7/2003 | Tsuchiko et al. ......... 257/335 |
| 6,614,089 B2 | * | 9/2003 | Nakamura et al. ....... 257/492 |
| 2001/0031533 A1 | | 10/2001 | Nishibe et al. |

FOREIGN PATENT DOCUMENTS

| | | |
|---|---|---|
| JP | 4-273165 | 9/1992 |
| JP | 7-283409 | 10/1995 |
| JP | 11-340454 | 12/1999 |

* cited by examiner

Primary Examiner—Olik Chaudhuri
Assistant Examiner—Lex H. Malsawma
(74) Attorney, Agent, or Firm—Lowe Hauptman & Berner, LLP

(57) ABSTRACT

A lateral short-channel DMOS includes an $N^-$-type epitaxial layer 110 in a $P^-$-type semiconductor substrate 108, a P-type well 114 in the $N^-$-type epitaxial layer 110 with a channel forming region C, an $N^+$-type source region 116 in the P-type well 114, an $N^+$-type drain region 118 in $N^-$-type epitaxial layer 110, and a gate electrode 122 formed via a gate insulating film 120 in at least an upper part of the channel forming region C out of a region from the $N^+$-type source region 116 to the $N^+$-type drain region 118. The lateral short-channel DMOS also includes an $N^+$-type well 140 that is formed in the $N^-$-type epitaxial layer 110 and includes a concentration of N-type dopant higher than the $N^-$-type epitaxial layer 110 and lower than the $N^+$-type drain region 118, with the $N^+$-type drain region 118 being formed in this $N^+$-type well 140.

16 Claims, 9 Drawing Sheets

10D

LATERAL SHORT-CHANNEL DMOS, METHOD OF MANUFACTURING THE SAME, AND SEMICONDUCTOR DEVICE

TECHNICAL FIELD

The present invention relates to a lateral short-channel DMOS that can be favorably used as a power MOSFET and a method of manufacturing the same. The present invention also relates to a semiconductor device equipped with this lateral short-channel DMOS.

RELATED ART

FIG. 14 is a cross-sectional view of a conventional lateral short-channel DMOS disclosed in U.S. Pat. No. 4,866,495. FIG. 15 is a plan view of a semiconductor device including this lateral short-channel DMOS. In this lateral short-channel DMOS 90, an N$^-$-type epitaxial layer 948 is formed on one surface of a P$^-$-type semiconductor substrate 940. A P-type well including a channel forming region is then formed in a surface of the N$^-$-type epitaxial layer 948, and N$^+$-type source regions 956, 957 are formed in a surface of this P-type well. An N$^+$-type drain region 970 is also formed in a surface of the N$^-$-type epitaxial layer 948. Gate electrodes 963, 964 are then formed via gate insulating films 961, 962 in an upper part of the channel forming region.

This lateral short-channel DMOS 90 is a lateral short-channel DMOS that can control the current flowing between the N$^+$-type source regions 956, 957 and the N$^+$-type drain region 970 according to the potential applied to the gate electrodes 963, 964, and is a so-called RESURF (Reduced Surface Field)-type lateral short-channel DMOS in which the substrate surface is almost completely depleted during an off state (that is, during reverse bias) in the case where the DMOS 90 is used for high-side switching. During reverse bias, the state where the substrate surface is almost completely depleted is realized by appropriately adjusting the thickness and dopant concentration of the N$^-$-type epitaxial layer 948, for example.

In this lateral short-channel DMOS 90, a P$^-$-type diffused region 971 is also formed in a floating state as a field reducing diffused region in a region between the P-type well and the N$^+$-type drain region 970 in the surface of the N$^-$-type epitaxial layer 948.

This means that this lateral short-channel DMOS 90 is constructed so that the substrate surface becomes almost completely depleted during reverse bias and since the P$^-$-type diffused region 971 is also formed in a floating state as a field reducing diffused region in a region between the P-type well and the N$^+$-type drain region 970 in the surface of the N$^-$-type epitaxial layer 948, the DMOS 90 exhibits high breakdown characteristics, and it becomes possible to integrate a low voltage control, a high-voltage level shift, and a gate driving circuit on the same substrate as a lateral short-channel DMOS.

However, with this lateral short-channel DMOS, in order to realize the almost completely depleted state for the substrate surface during reverse bias, the dopant concentration of the N$^-$-type epitaxial layer 948 cannot be set very high, so that there has been the problem of the resistance being high while the lateral short-channel DMOS is ON.

The present invention was conceived in order to solve the above problem and it is an object of the present invention to reduce the ON resistance while maintaining high breakdown characteristics to provide a lateral short-channel DMOS with high breakdown characteristics and superior current driving characteristics. It is another object of the present invention to provide a method of manufacturing a lateral short-channel DMOS that can manufacture this kind of superior lateral short-channel DMOS. It is yet another object of the present invention to provide a semiconductor device that includes this kind of superior lateral short-channel DMOS.

DISCLOSURE OF THE INVENTION

A lateral short-channel DMOS according to the present invention is a lateral short-channel DMOS in which a first conductivity-type semiconductor region is formed, a surface of the first conductivity-type semiconductor region becoming almost completely depleted during reverse bias, the lateral short-channel DMOS including:

the first conductivity-type semiconductor region formed in one surface of a semiconductor substrate;

a second conductivity-type well formed in a surface of the first conductivity-type semiconductor region and includes a channel forming region, the second conductivity-type being an inverse of the first conductivity-type;

a first conductivity-type source region formed in the surface of the second conductivity-type well;

a first conductivity-type drain region formed in the surface of the first conductivity-type semiconductor region; and a gate electrode that is formed via a gate insulating film in an upper part of at least the channel forming region out of a region from the first conductivity-type source region to the first conductivity-type drain region, the lateral short-channel DMOS being characterized by further including:

a first conductivity-type well formed in the surface of the first conductivity-type semiconductor region and including a higher concentration of first conductivity-type dopant than the first conductivity-type semiconductor region and a lower concentration of first conductivity-type dopant than the first conductivity-type drain region, wherein the first conductivity-type drain region is formed in a surface of the first conductivity-type well.

This means that according to the lateral short-channel DMOS according to the present invention, the first conductivity-type drain region is formed in a surface of the first conductivity-type well that includes a higher concentration of first conductivity-type dopant than the first conductivity-type semiconductor substrate, so that part of the first conductivity-type semiconductor region that forms a current path between the first conductivity-type drain region and the first conductivity-type source region when the lateral short-channel DMOS is ON is replaced with the first conductivity-type well that has low resistance, so that the ON resistance can be reduced while maintaining the condition that the surface of the first conductivity-type semiconductor region is almost completely depleted during reverse bias. Accordingly, the lateral short-channel DMOS according to the present invention is a lateral short-channel DMOS with high breakdown characteristics and superior current driving characteristics.

Also, according to the lateral short-channel DMOS according to the present invention, the first conductivity-type drain region is formed in a surface of the first conductivity-type well that includes a higher concentration of first conductivity-type dopant than the first conductivity-type semiconductor region, so that in a region from the first conductivity-type drain region to the first conductivity-type semiconductor region, the concentration gradient of the first conductivity-type dopant decreases in steps. This means that the concentration of electric field at the surface (especially a part with large curvature) of the first conductivity-type drain region is reduced and as a result it is possible to stabilize the breakdown characteristics.

Also, in a region from the first conductivity-type drain region to the first conductivity-type semiconductor region, since the concentration gradient of the first conductivity-type dopant decreases in steps, as can be seen from the planar structure also, the concentration of electric field in a surface (especially a part with large curvature) of the first conductivity-type drain region is suppressed, and as a result, the drain region itself can be made finer and a part with large curvature can be produced in the drain region, which increases the freedom with which the planar structure can be designed. Accordingly, by finely bending the gate electrode to increase the total length, it is easy to make the gate electrode wider and reduce the ON resistance.

Also, according to the lateral short-channel DMOS according to the present invention, since the first conductivity-type well that includes a higher concentration of first conductivity-type dopant than the first conductivity-type semiconductor region is formed in the surface of the first conductivity-type semiconductor region, during reverse bias the first conductivity-type well can absorb the depletion layer that extends from the semiconductor substrate side, so that there is the effect that the electric field in the first conductivity-type semiconductor region can be more evenly distributed and the breakdown characteristics can be stabilized further.

For the lateral short-channel DMOS according to the present invention, a concentration of first conductivity-type dopant included in the first conductivity-type well should preferably be in a range of $1 \times 10^{+18}$ ions/cm$^3$ to $3 \times 10^{+20}$ ions/cm$^3$.

Here, the concentration of dopant in the first conductivity-type well should be $1 \times 10^{+18}$ ions/cm$^3$ or above since this makes it possible for the ON resistance to be sufficiently reduced while maintaining the condition that the surface of the first conductivity-type semiconductor region is almost completely depleted during reverse bias. Also, the concentration of dopant in the first conductivity-type well should be $3 \times 10^{+20}$ ions/cm$^3$ or below since this makes it possible to reduce the concentration of electric field in the surface (especially a part with large curvature) of the first conductivity-type drain region and so improve the breakdown characteristics, and also makes it possible for the first conductivity-type well to absorb the depletion layer that extends from the semiconductor substrate side during reverse bias so as to distribute the electric field in the first conductivity-type semiconductor region more evenly and further stabilize the breakdown characteristics.

In view of the above, the first conductivity-type well should preferably have a concentration in a range of $5 \times 10^{+18}$ ions/cm$^3$ to $1 \times 10^{+20}$ ions/cm$^3$ and more preferably a concentration in a range of $1 \times 10^{+19}$ ions/cm$^3$ to $5 \times 10^{+19}$ ions/cm$^3$.

Of course, since it is necessary to reduce the concentration of electric field at the surface (especially a part with large curvature) of the first conductivity-type drain region to improve the breakdown characteristics, the concentration of first conductivity-type dopant in the first conductivity-type well needs to be set lower than the concentration of the first conductivity-type drain region.

In the lateral short-channel DMOS according to the present invention, the first conductivity-type well should preferably be formed at least 1.5 µm deep.

By using this construction, it is possible to sufficiently reduce the ON resistance while maintaining the condition that the surface of the first conductivity-type semiconductor region is almost completely depleted during reverse bias. It is also possible to reduce the concentration of electric field at the surface (especially a part with large curvature) of the first conductivity-type drain region and so improve the breakdown characteristics. Furthermore, during reverse bias the first conductivity-type well absorbs the depletion layer that extends from the semiconductor substrate side, so that it is possible for the electric field in the first conductivity-type semiconductor region to be more evenly distributed and for the breakdown characteristics to be stabilized further.

In view of the above, the first conductivity-type well should preferably be formed at least 2 µm deep and more preferably be formed at least 2.5 µm deep The lateral short-channel DMOS according to the present invention should preferably further include a second conductivity-type diffused region that is formed in a region of the surface of the first conductivity-type semiconductor region between the first conductivity-type well and the second conductivity-type well in a floating state so as to not contact the first conductivity-type well and the second conductivity-type well.

By using this construction, it is possible to reduce the electric field strength during reverse bias in a region from the second conductivity-type well to the second conductivity-type diffused region, so that the breakdown characteristics can be stabilized further. It should be noted that the current between the first conductivity-type drain region and the first conductivity-type source region when the lateral short-channel DMOS is ON avoids the second conductivity-type diffused region and flows in a deeper part (the first conductivity-type semiconductor region) than the second conductivity-type diffused region, so that there is no increase in ON resistance.

In the lateral short-channel DMOS according to the present invention, it is preferable that the gate electrode is provided opposite the first conductivity-type semiconductor region in a region from the channel forming region to the second conductivity-type diffused region with the gate insulating film in between, the gate electrode is provided opposite the first conductivity-type semiconductor region in a part of a region from the second conductivity-type diffused region to the first conductivity-type drain region with a field oxide film in between, and a stepped part of the gate electrode is formed above the second conductivity-type diffused region.

By using the above construction, in a part of a region from the second conductivity-type diffused region to the first conductivity-type drain region, the gate electrode is provided opposite the first conductivity-type semiconductor region via a relatively thick field oxide film, so that the capacity between the gate and the source and between the gate and the drain can be reduced and the high-speed switching characteristics can be improved.

Also, at this time, the stepped part of the gate electrode is formed above the second conductivity-type diffused region, so that a localized increase in electric field strength due to the stepped part of the gate electrode can be reduced by the second conductivity-type diffused region and a worsening of the breakdown characteristics can be suppressed.

In the lateral short-channel DMOS according to the present invention, a first conductivity-type diffused region with a higher concentration of first conductivity-type dopant than the first conductivity-type semiconductor region should preferably be formed on a first conductivity-type semiconductor region surface side of the second conductivity-type diffused region.

By using this construction, the current from the first conductivity-type drain region to the first conductivity-type source region when the lateral short-channel DMOS is ON flows in a deeper part (the first conductivity-type semiconductor region) than the second conductivity-type diffused region and also flows in part of the first conductivity-type diffused region that has relatively low resistance, so that the ON resistance can be reduced further.

Also, during reverse bias, the depletion layer can extend easily from the PN junction formed by the first conductivity-type diffused region and the second conductivity-type diffused region, so that there is also the effect that the electric field is distributed further and the breakdown characteristics can be stabilized even further.

In the lateral short-channel DMOS according to the present invention, the first conductivity-type diffused region should preferably contact the first conductivity-type well.

By using this construction, the ON resistance of a current path from the first conductivity-type well to the first conductivity-type diffused region can be reduced further.

The lateral short-channel DMOS according to the present invention should preferably further include a second second conductivity-type diffused region in a region inside the second conductivity-type well in a planar direction of the first conductivity-type semiconductor region, the second second conductivity-type diffused region including a higher concentration of second conductivity-type dopant than the second conductivity-type well and having a deeper depth of diffusion than the second conductivity-type well.

By using this construction, the final electric field strength when breakdown occurs can be reduced, so that the upper limit of the allowable current during breakdown can be increased.

The lateral short-channel DMOS according to the present invention should preferably further include a third second conductivity-type diffused region in a region inside the second conductivity-type well in a planar direction of the first conductivity-type semiconductor region, the third second conductivity-type diffused region including a higher concentration of second conductivity-type dopant than the second conductivity-type well and having a depth of diffusion that reaches the semiconductor substrate.

By using this construction, the final electric field strength when breakdown occurs can be reduced, so that the upper limit of the allowable current during breakdown can be increased. Also, a bias of the source electrode that is connected to the first conductivity-type source region and the semiconductor substrate can be changed simultaneously, so that the electric field strength inside the first conductivity-type semiconductor region can be reduced further.

A lateral short-channel DMOS according to the present invention should preferably further include a source electrode connected to the first conductivity-type source region; and a drain electrode connected to the first conductivity-type drain region, the lateral short-channel DMOS having a planar structure where the drain electrode is enclosed within the gate electrode and the gate electrode is enclosed within the source electrode.

By using this construction, the first conductivity-type drain region that is more susceptible to breakdown is enclosed within the gate electrode and the gate electrode is enclosed within the first conductivity-type source region, so that the breakdown characteristics can be stabilized in a periphery of the first conductivity-type drain region.

In the lateral short-channel DMOS according to the present invention, the first conductivity-type semiconductor region should preferably be a first conductivity-type well formed in a surface of an epitaxial layer formed on the semiconductor substrate.

By using this construction, in a semiconductor device in which the lateral short-channel DMOS has been integrated with other elements (such as logic circuits), it is possible to control the breakdown characteristics of the lateral short-channel DMOS via the dopant concentration of the first conductivity-type semiconductor region, so that it is possible to set the dopant concentration of the epitaxial layer at a concentration (for example, a lower concentration than the first conductivity-type semiconductor region) and a conductivity-type (for example, the first conductivity-type or the second conductivity-type) that are suited to the other elements (such as logic circuits), which makes it possible to produce a semiconductor device with even more superior characteristics.

It should be noted that when the lateral short-channel DMOS according to the present invention is used as an N-channel-type lateral short-channel DMOS, an $N^-$-type semiconductor region is selected as the first conductivity-type semiconductor region, and in this case, a RESURF-type lateral short-channel DMOS can be produced regardless of whether an $N^-$-type or a $P^-$-type epitaxial layer is used as the epitaxial layer.

Also when the lateral short-channel DMOS according to the present invention is used as a P-channel-type lateral short-channel DMOS, a $P^-$-type semiconductor region is selected as the first conductivity-type semiconductor region, and in this case, a RESURF-type lateral short-channel DMOS can be produced when an $N^-$-type epitaxial layer is used as the epitaxial layer.

In the lateral short-channel DMOS according to the present invention, it is also preferable for the first conductivity-type semiconductor region to be a first conductivity-type epitaxial layer formed on the semiconductor substrate.

By using this construction, a lateral short-channel DMOS with a lower cost than the lateral short-channel DMOS described above can be provided.

A "method of manufacturing a lateral short-channel DMOS" according to the present invention is a method of manufacturing a "lateral short-channel DMOS" according to the present invention and includes the following steps in order:

(a) a first step of preparing a semiconductor substrate on whose surface the first conductivity-type semiconductor region has been formed;

(b) a second step of forming a first ion implanting mask with a predetermined opening on a surface of the first conductivity-type semiconductor region and implanting a first conductivity-type dopant with the first ion implanting mask as a mask to form the first conductivity-type well;

(c) a third step of forming, after the first ion implanting mask has been removed, a field oxide film with a predetermined opening on the surface of the first conductivity-type semiconductor region, and forming the gate insulating film by thermal oxidization at the opening of the field oxide film;

(d) a fourth step of forming the gate electrode in a predetermined region on the gate insulating film and the field oxide film;

(e) a fifth step of forming a second ion implanting mask with a predetermined opening on the surface of the first conductivity-type semiconductor region and implanting second conductivity-type dopant with the second ion implanting mask and the gate electrode as a mask to form the second conductivity-type well;

(f) a sixth step of forming, after the second ion implanting mask has been removed, a third ion implanting mask with a predetermined opening on the surface of the first conductivity-type semiconductor region and implanting first conductivity-type dopant with at least the third ion implanting mask and the gate electrode as a mask to form the first conductivity-type source region and the first conductivity-type drain region; and (g) a seventh step of forming, after the third ion implanting mask has been removed, an interlayer dielectric film, opening a predetermined contact hole in the interlayer dielectric film, and then forming electrodes of a metal layer on the interlayer dielectric film.

This means that according to the method of manufacturing a lateral short-channel DMOS according to the present invention, it is possible to obtain the lateral short-channel DMOS according to the present invention that has high breakdown characteristics and superior current driving characteristics.

The method of manufacturing a lateral short-channel DMOS according to the present invention may further include, between the first step and the second step, a step of forming a fourth ion implanting mask with a predetermined opening on the surface of the first conductivity-type semiconductor region and implanting a second conductivity-type dopant with the fourth ion implanting mask as a mask to form a second conductivity-type diffused region.

By using this method, it is possible to introduce a second conductivity-type diffused region in a floating state into the lateral short-channel DMOS according to the present invention described above, so that the electric field strength in a region from the second conductivity-type well to the second conductivity-type diffused region during reverse bias can be reduced and the breakdown characteristics can be stabilized further.

A semiconductor device according to the present invention includes the lateral short-channel DMOS according to the present invention.

This means that the semiconductor device according to the present invention includes a lateral short-channel DMOS with high breakdown characteristics and superior current driving characteristics and so is a superior power control semiconductor device.

Also, the semiconductor device according to the present invention can also include logic circuits. By doing so, the semiconductor device according to the present invention includes a lateral short-channel DMOS with high breakdown characteristics and superior current driving characteristics and logic circuits for controlling the lateral short-channel DMOS, and so is a superior power control semiconductor device.

BEST MODE FOR CARRYING OUT THE PRESENT INVENTION

Embodiments of the present invention are described in detail below with reference to the attached drawings.

Embodiment 1

Figure 1:
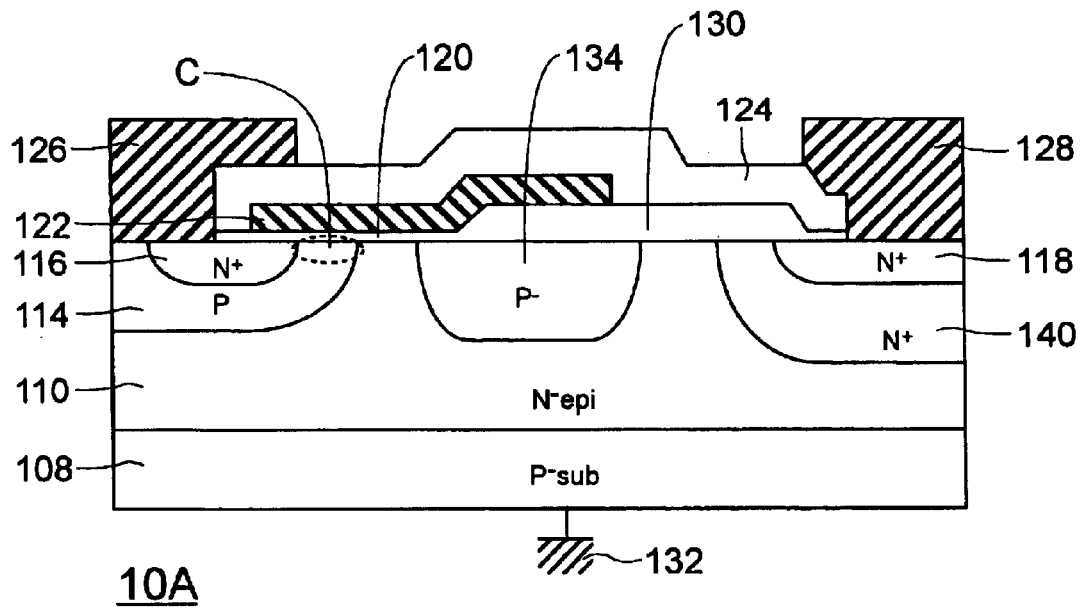
FIG. 1 is a cross-sectional view of a lateral short-channel DMOS according to Embodiment 1.
Figure 2:
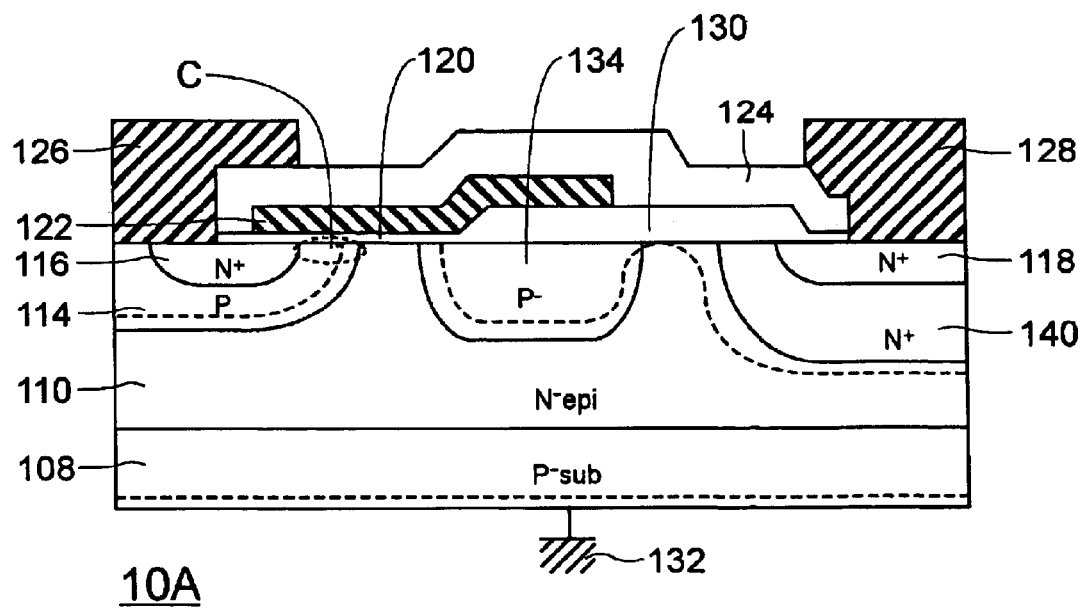
FIG. 2 is a diagram useful in explaining operational effects of the lateral short-channel DMOS according to Embodiment 1.
Figure 3:
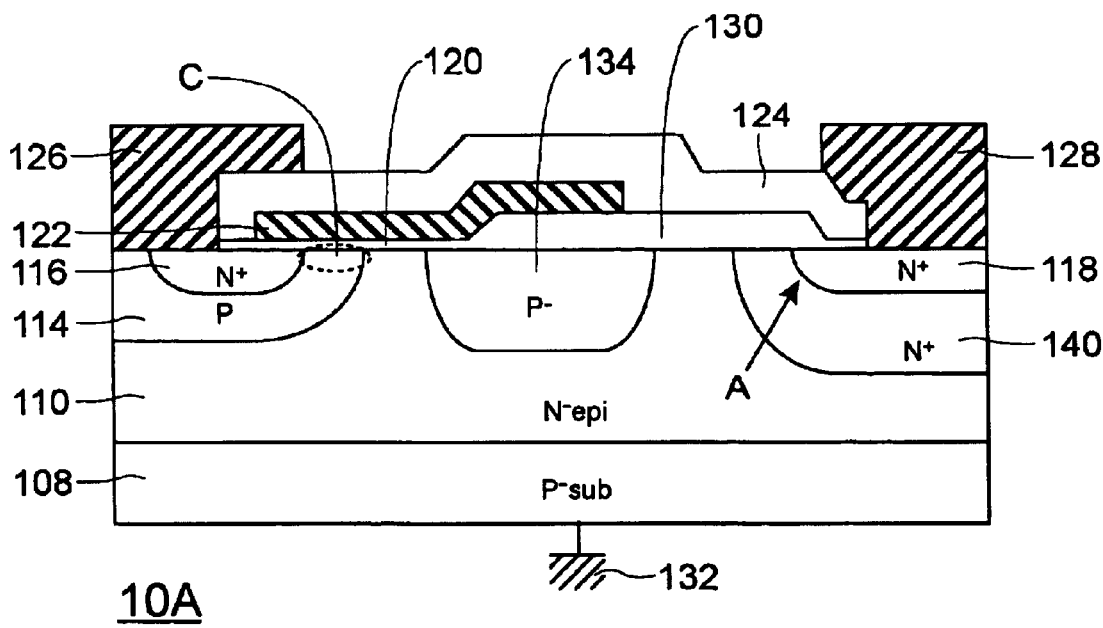
FIG. 3 is a diagram useful in explaining operational effects of the lateral short-channel DMOS according to Embodiment 1.
Figure 4:
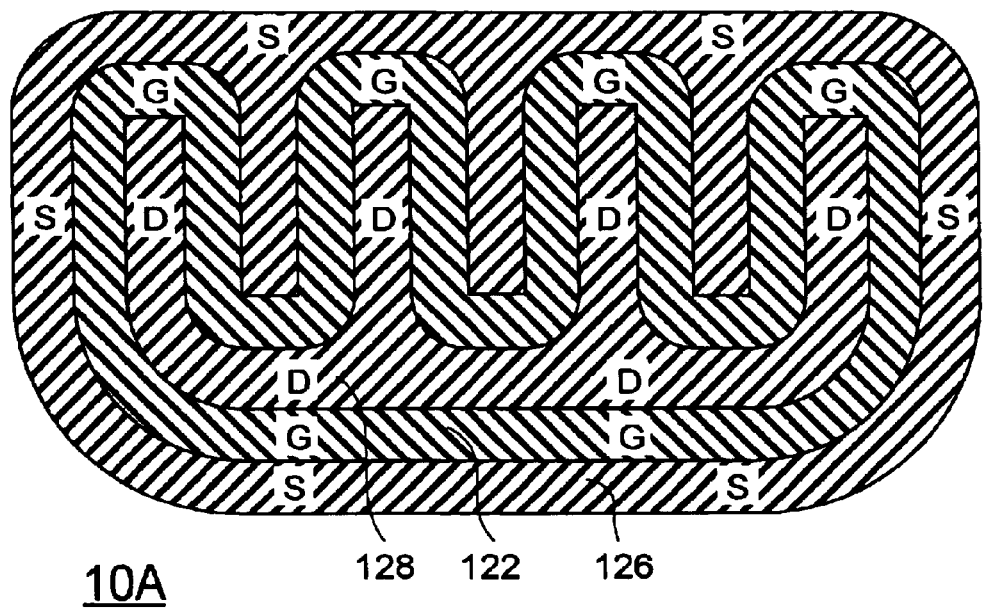
FIG. 4 is a plan view of the lateral short-channel DMOS according to Embodiment 1.

FIG. 1 is a cross-sectional view of a lateral short-channel DMOS according to Embodiment 1. FIGS. 2 and 3 are diagrams useful in explaining operational effects of the lateral short-channel DMOS according to Embodiment 1. FIG. 4 is a plan view of the lateral short-channel DMOS according to Embodiment 1.

As shown in FIG. 1, a lateral short-channel DMOS 10A according to Embodiment 1 has an $N^-$-type epitaxial layer (first conductivity-type semiconductor region) 110 formed on one surface of a $P^-$-type semiconductor substrate (semiconductor substrate) 108, and as shown in FIG. 2 is a so-called RESURF-type lateral short-channel DMOS in which the surface of the $N^-$-type epitaxial layer 110 is almost completely depleted during reverse bias.

In this lateral short-channel DMOS 10A, a P-type well (second conductivity-type well) 114 including a channel forming region C is formed in the surface of the $N^-$-type epitaxial layer 110, and an $N^+$-source region (first conductivity-type source region) 116 is formed in the surface of this P-type well 114. An $N^+$-type well (a first conductivity-type well) 140 is also formed in the surface of the $N^-$-type epitaxial layer 110, and an $N^+$-type drain region (first conductivity-type drain region) 118 is formed in the surface of this $N^+$-type well 140. Also, a gate electrode 122 is formed via a gate insulating film 120 in an upper part of the channel forming region C out of a region from the $N^+$-type source region 116 to the $N^+$-type drain region 118.

The $N^+$-type well 140 includes a higher concentration of N-type dopant than the $N^-$-type epitaxial layer 110 and a lower concentration of N-type dopant than the $N^+$-type drain region 118.

This means that according to this lateral short-channel DMOS 10A, the $N^+$-type drain region 118 is formed in a surface of the $N^+$-type well 140 that includes a higher concentration of N-type dopant than the N⁻-type epitaxial layer 110, when the DMOS 10A is ON, part of the N⁻-type epitaxial layer 110 that forms a current path from the N⁺-type drain region 118 to the N⁺-type source region 116 is replaced with the N⁺-type well 140, so that the ON resistance can be reduced while maintaining the condition that the surface of the N⁻-type epitaxial layer 110 becomes almost completely depleted during reverse bias. Accordingly, the lateral short-channel DMOS 10A according to Embodiment 1 has high breakdown characteristics superior current driving characteristics.

Additionally, according to the lateral short-channel DMOS 10A according to Embodiment 1, the N⁺-type drain region 118 is formed in the surface of the N⁺-type well 140 that includes a higher concentration of N-type dopant than the N⁻-type epitaxial layer 110, so that in a region from the N⁺-type drain region 118 to the N⁻-type epitaxial layer 110, the concentration gradient for N-type dopant is reduced in steps. This means that the electric field concentration in the surface of the N⁺-type drain region 118 (the part with the large curvature labeled "A" in FIG. 3) is eased so that the breakdown characteristics of this part can be improved.

Also, since the concentration gradient for N-type dopant is reduced in steps in a region from the N⁺-type drain region 118 to the N⁻-type epitaxial layer 110, as can be seen from the planar structure also, the concentration of electric field in the surface of the N⁺-type drain region 118 (such as the part labeled "A" in FIG. 3) is suppressed, and as a result, the drain region itself can be made finer and a part with large curvature can be produced in the drain region, which increases the freedom with which the planar structure can be designed. Accordingly, as shown in FIG. 4, by finely bending the gate electrode 122 to increase the total length of the gate electrode 122, it is easy to make the gate electrode wider and reduce the ON resistance.

Also, according to the lateral short-channel DMOS 10A according to Embodiment 1, since the N⁺-type well 140 that includes a higher concentration of N-type dopant than the N⁻-type epitaxial layer 110 is formed in the surface of the N⁻-type epitaxial layer 110, during reverse bias the N⁺-type well 140 can absorb the depletion layer that extends from the P⁻-type semiconductor substrate 108 side, so that there is the effect that the electric field in the N⁻-type epitaxial layer 110 can be more evenly distributed and the breakdown characteristics can be stabilized further.

In the lateral short-channel DMOS 10A according to Embodiment 1, the N⁺-type well 140 includes $2 \times 10^{+19}$ ions/cm³, for example, of N-type dopant. This means that the ON resistance can be sufficiently reduced while maintaining the condition that the surface of the N⁻-type epitaxial layer 110 becomes almost completely depleted during reverse bias, the concentration of electric field in the surface of the N⁺-type drain region 118 (such as the part labeled "A" in FIG. 3) is reduced so as to improve the breakdown characteristics, and during reverse bias the N⁺-type well 140 can absorb the depletion layer that extends from the P⁻-type semiconductor substrate 108 side, so that there is the effect that the electric field can be more evenly distributed in the N⁻-type epitaxial layer 110 and the breakdown characteristics can be stabilized further.

In the lateral short-channel DMOS 10A according to Embodiment 1, the N⁺-type well 140 is formed with a depth of 4 μm. This means that the ON resistance can be sufficiently reduced while maintaining the condition that the surface of the N⁻-type epitaxial layer 110 becomes almost completely depleted during reverse bias. Also, the concentration of electric field in the surface of the N⁺-type drain region 118 (such as the part labeled "A" in FIG. 3) is reduced, so that the breakdown characteristics can be improved. Furthermore, during reverse bias the N⁺-type well 140 can absorb the depletion layer that extends from the P⁻-type semiconductor substrate 108 side, so that the electric field in the N⁻-type epitaxial layer 110 can be more evenly distributed and there is the effect that the breakdown characteristics can be stabilized even further.

In the lateral short-channel DMOS 10A according to Embodiment 1, a P⁻-type diffused region (second conductivity-type diffused region) 134 is also formed in a floating state in the surface of the N⁻-type epitaxial layer 110 in a region between the N⁺-type well 140 and the P-type well 114 so as to not contact the N⁺-type well 140 and the P-type well 114.

This means that the electric field strength during reverse bias is reduced in a region from the P-type well 114 to the P⁻-type diffused region 134, so that the breakdown characteristics can be stabilized further. It should be noted that the current that flows from the N⁺-type drain region 118 to the N⁺-type source region 116 when the lateral short-channel DMOS 10A is ON avoids the P⁻-type diffused region 134 and flows in a deeper part (the N⁻-type epitaxial layer 110) than the P⁻-type diffused region 134, so that there is no increase in the ON resistance.

In the lateral short-channel DMOS 10A according to Embodiment 1, the gate electrode 122 is provided opposite the N⁻-type epitaxial layer 110 in a region from the channel forming region C to the P⁻-type diffused region 134 with the gate insulating film 120 in between and is provided opposite the N⁻-type epitaxial layer 110 in part of a region from the P⁻-type diffused region 134 to the N⁺-type drain region 118 with a field oxide film 130 in between. A stepped part of the gate electrode 122 is formed above the P⁻-type diffused region 134.

This means that in a part of a region from the P⁻-type diffused region 134 to the N⁺-type drain region 118, the gate electrode 122 is provided opposite the N⁻-type epitaxial layer 110 with the field oxide film 130 that is relatively thick in between, so that the capacity between the gate and the source and between the gate and the drain can be reduced and the high-speed switching characteristics can be improved.

At this time, the stepped part of the gate electrode 122 is formed above the P⁻-type diffused region 134, so that a localized increase in electric field strength due to the stepped part of the gate electrode 122 can be reduced by the P⁻-type diffused region 134 and a worsening of the breakdown characteristics can be suppressed.

As shown in FIG. 1, the lateral short-channel DMOS 10A according to Embodiment 1 further includes a source electrode 126 that is connected to the N⁺-type source region 116 and a drain electrode 128 that is connected to the N⁺-type drain region 118. As shown in FIG. 4, the lateral short-channel DMOS 10A has a planar structure in which the drain electrode 128 is enclosed within the gate electrode 122 and the gate electrode 122 is enclosed within the source electrode 126. By using this construction, the N⁺-type drain region 118 that is more susceptible to breakdown is enclosed within the gate electrode 122 and the gate electrode 122 is enclosed within the N⁺-type source region 116, so that the breakdown characteristics can be stabilized in a periphery of the N⁺-type drain region 118.

Embodiment 2

Figure 5:
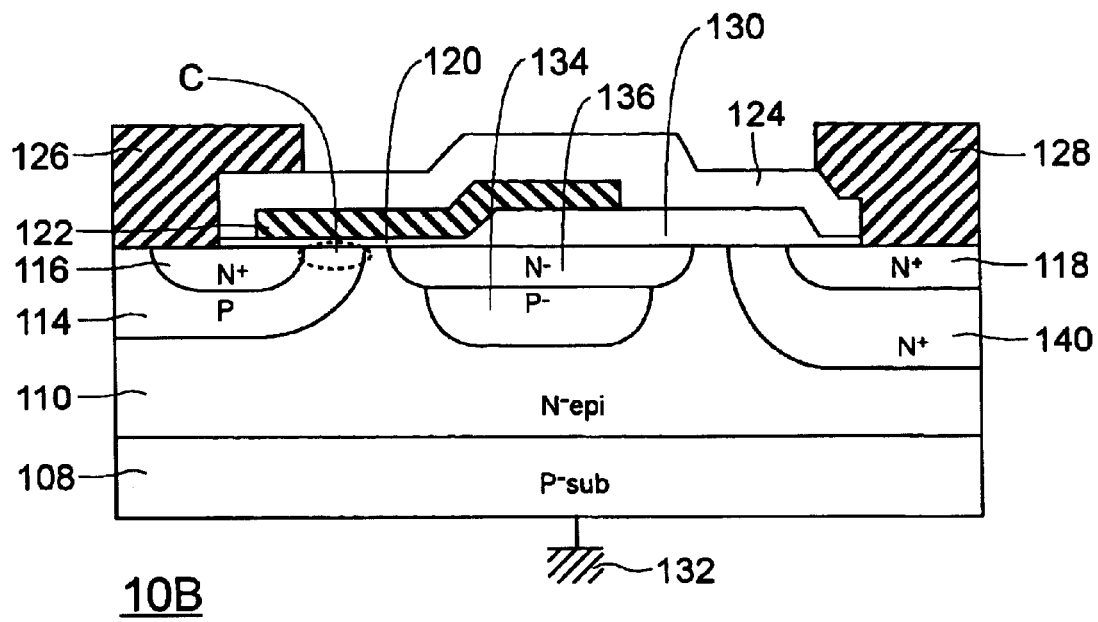
FIG. 5 is a cross-sectional view of a lateral short-channel DMOS according to Embodiment 2.

FIG. 5 is a cross-sectional view of a lateral short-channel DMOS according to Embodiment 2. A lateral short-channel DMOS 10B according to Embodiment 2 has a similar structure to the lateral short-channel DMOS 10A according to Embodiment 1, but differs as shown in FIG. 5 in that an N⁻-type diffused region 136 including a higher concentration of N-type dopant than the N⁻-type epitaxial layer 110 is also formed in an N⁻-type epitaxial layer 110 surface side of the P⁻-type diffused region 134.

This means that according to the lateral short-channel DMOS 10B according to Embodiment 2, in addition to the effects of the lateral short-channel DMOS 10A according to Embodiment 1, the following effect is obtained. That is, the current from the N⁺-type drain region 118 to the N⁺-type source region 116 when the DMOS 10B is ON flows in a deeper part (the N⁻-type epitaxial layer 110) than the P⁻-type diffused region 134 and also flows in part of the N⁻-type diffused region 136 that has relatively low resistance, so that the ON resistance can be reduced further.

Also, during reverse bias, the depletion layer can extend easily from the PN junction formed by the N⁻-type diffused region 136 and the P⁻-type diffused region 134, so that there is also the effect that the electric field is distributed further and the breakdown characteristics can be stabilized even further.

Embodiment 3

Figure 6:
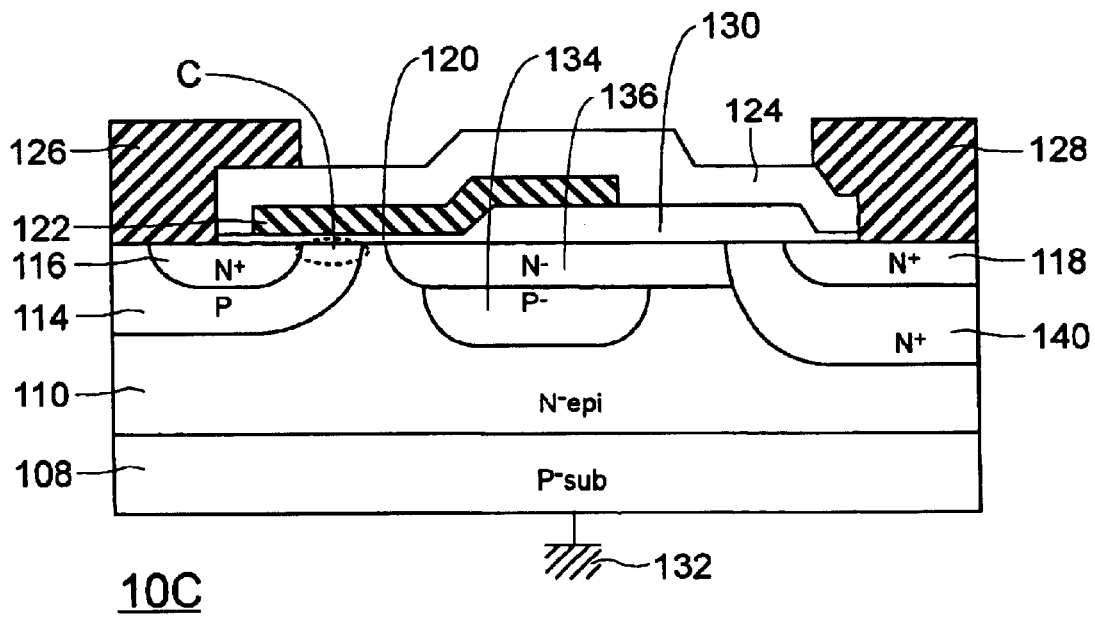
FIG. 6 is a cross-sectional view of a lateral short-channel DMOS according to Embodiment 3.

FIG. 6 is a cross-sectional view of a lateral short-channel DMOS according to Embodiment 3. A lateral short-channel DMOS 10C according to Embodiment 3 has a similar structure to the lateral short-channel DMOS 10B according to Embodiment 2, but differs as shown in FIG. 6 in that the N⁻-type diffused region 136 contacts the N⁺-type well 140.

According to the lateral short-channel DMOS 10C according to Embodiment 3, in addition to the effects of the lateral short-channel DMOS 10B according to Embodiment 2, the following effect is obtained. That is, the ON resistance of a current path from the N⁺-type well 140 to the N⁻-type diffused region 136 can be reduced further.

Embodiment 4

Figure 7:
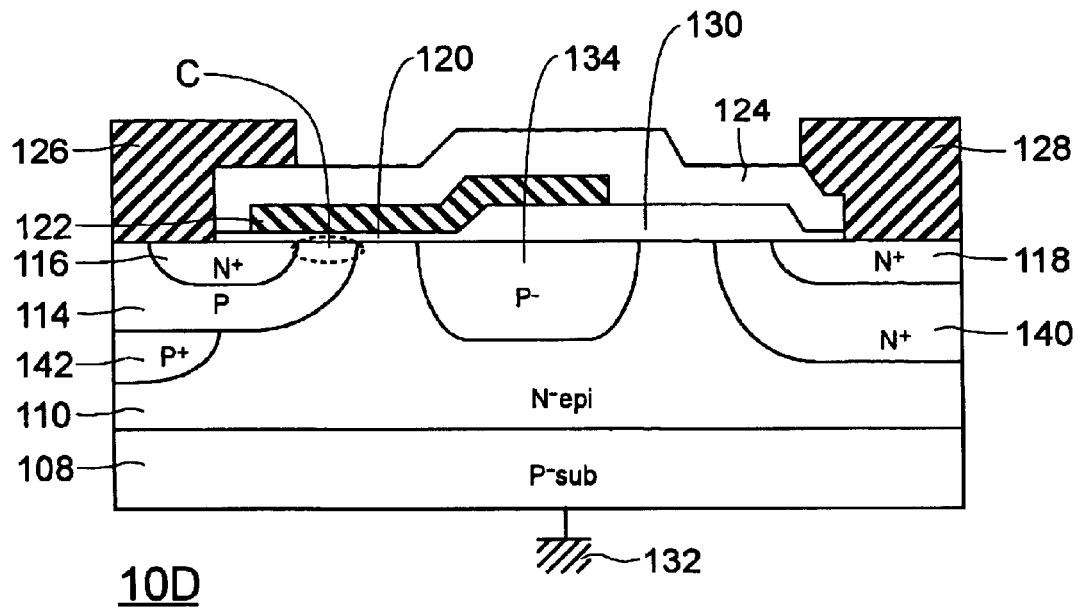
FIG. 7 is a cross-sectional view of a lateral short-channel DMOS according to Embodiment 4.

FIG. 7 is a cross-sectional view of a lateral short-channel DMOS according to Embodiment 4. A lateral short-channel DMOS 10D according to Embodiment 4 has a similar structure to the lateral short-channel DMOS 10A according to Embodiment 1, but differs as shown in FIG. 7 in that a second P⁺-type diffused region 142 including a higher concentration of P-type dopant than the P-type well 114 and having a deeper depth of diffusion than the P-type well 114 is formed in a region inside the P-type well 114 in a planar direction of the N⁻-type epitaxial layer 110.

This means that according to the lateral short-channel DMOS 10D according to Embodiment 4, in addition to the effects of the lateral short-channel DMOS 10A according to Embodiment 1, the following effect is obtained. That is, the final electric field strength when breakdown occurs can be reduced, so that the upper limit of the allowable current during breakdown can be increased.

Embodiment 5

Figure 8:
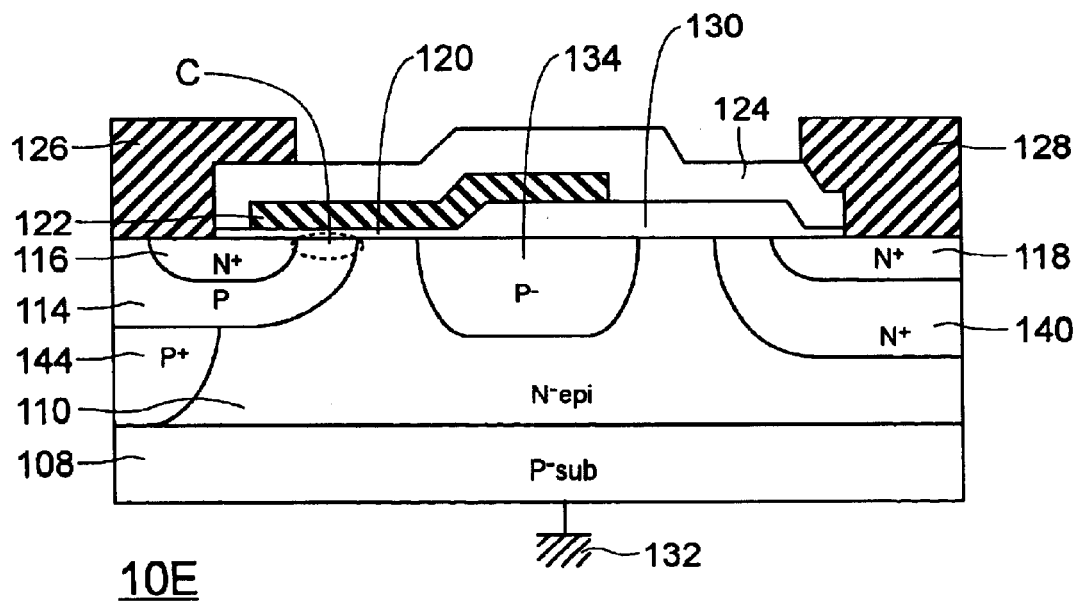
FIG. 8 is a cross-sectional view of a lateral short-channel DMOS according to Embodiment 5.

FIG. 8 is a cross-sectional view of a lateral short-channel DMOS according to Embodiment 5. A lateral short-channel DMOS 10E according to Embodiment 5 has a similar structure to the lateral short-channel DMOS 10D according to Embodiment 4, but differs as shown in FIG. 8 in that a third P⁺-type diffused region 144 including a higher concentration of P-type dopant than the P-type well 114 and having a depth of diffusion than reaches the P⁻-type semiconductor substrate 108 is formed in a region inside the P-type well 114 in a planar direction of the N⁻-type epitaxial layer 110.

This means that according to the lateral short-channel DMOS 10E according to Embodiment 5, in addition to the effects of the lateral short-channel DMOS 10D according to Embodiment 4, the following effect is obtained. A bias of the source electrode that is connected to the N⁺-type source region 116 and the P⁻-type semiconductor substrate 108 can be changed simultaneously, so that the electric field strength inside the N⁻-type epitaxial layer 110 can be reduced further.

Embodiment 6

Figure 9:
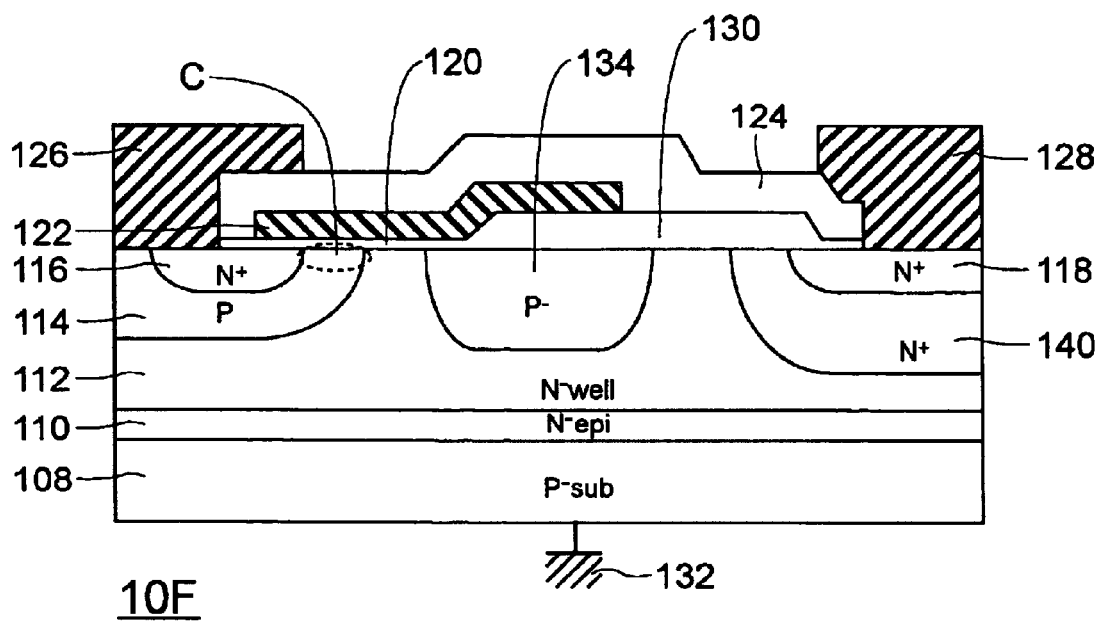
FIG. 9 is a cross-sectional view of a lateral short-channel DMOS according to Embodiment 6.

FIG. 9 is a cross-sectional view of a lateral short-channel DMOS according to Embodiment 6. A lateral short-channel DMOS 10F according to Embodiment 6 has a similar structure to the lateral short-channel DMOS 10A according to Embodiment 1, but differs as shown in FIG. 9 in that the N⁻-type epitaxial layer 110 is formed on the P⁻-type semiconductor substrate 108 and an N⁻-type well 112 is then formed in the surface of the N⁻-type epitaxial layer 110.

This means that according to the lateral short-channel DMOS 10F according to Embodiment 6, in addition to the effects of the lateral short-channel DMOS 10A according to Embodiment 1, the following effect is obtained. That is, in a semiconductor device in which the lateral short-channel DMOS 10F has been integrated with other elements (such as logic circuits), it is possible to control the breakdown characteristics of the lateral short-channel DMOS 10F via the dopant concentration of the N⁻-type well 112, so that it is possible to set the dopant concentration of the N⁻-type epitaxial layer 110 at a concentration (for example, a lower concentration than the N⁻-type well 112) that is suited to the other elements (such as logic circuits), which makes it possible to produce a semiconductor device with even more superior characteristics.

Embodiment 7

Figure 10:
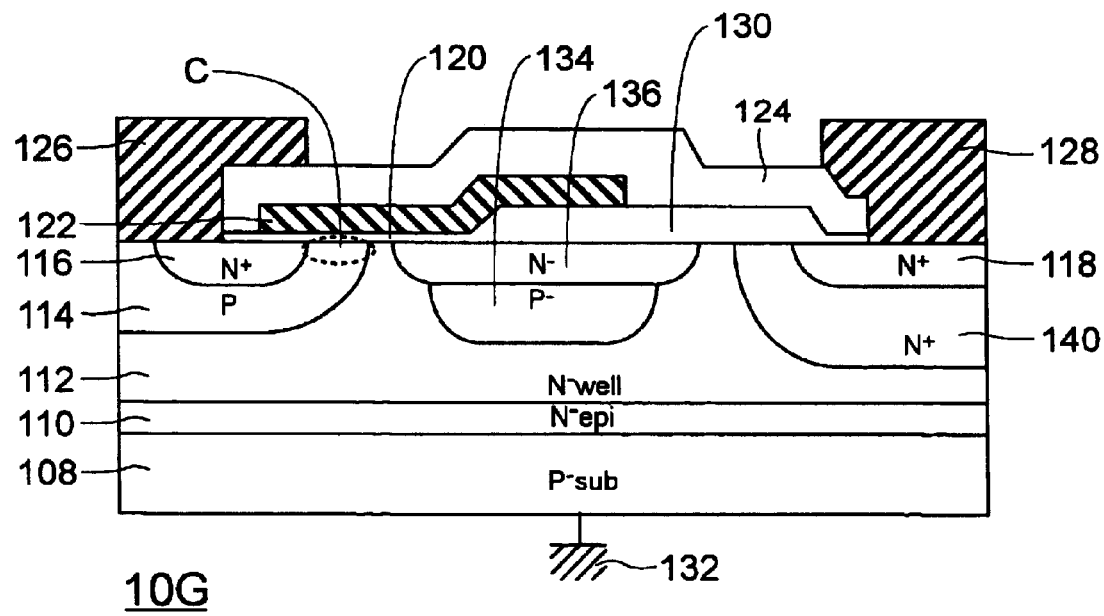
FIG. 10 is a cross-sectional view of a lateral short-channel DMOS according to Embodiment 7.

FIG. 10 is a cross-sectional view of a lateral short-channel DMOS according to Embodiment 7. A lateral short-channel DMOS 10G according to Embodiment 7 has a similar structure to the lateral short-channel DMOS 10F according to Embodiment 6, but differs as shown in FIG. 10 in that an N⁻-type diffused region 136 with a higher concentration of N-type dopant than the N⁻-type well 112 is formed on an N⁻-type well 112 surface side of the P⁻-type diffused region 134.

This means that according to the lateral short-channel DMOS 10G according to Embodiment 7, in addition to the effects of the lateral short-channel DMOS 10F according to Embodiment 6, the following effect is obtained. That is, the current from the N⁺-type drain region 118 to the N⁺-type source region 116 when the DMOS 10G is ON flows in a deeper part (the N⁻-type well 112) than the P⁻-type diffused region 134 and also flows in part of the N⁻-type diffused region 136 that has relatively low resistance, so that the ON resistance can be reduced further.

Also, during reverse bias, the depletion layer can extend easily from the PN junction formed by the N⁻-type diffused region 136 and the P⁻-type diffused region 134, so that the electric field is distributed further and there is also the effect that the breakdown characteristics can be stabilized even further.

Embodiment 8

Figure 11:
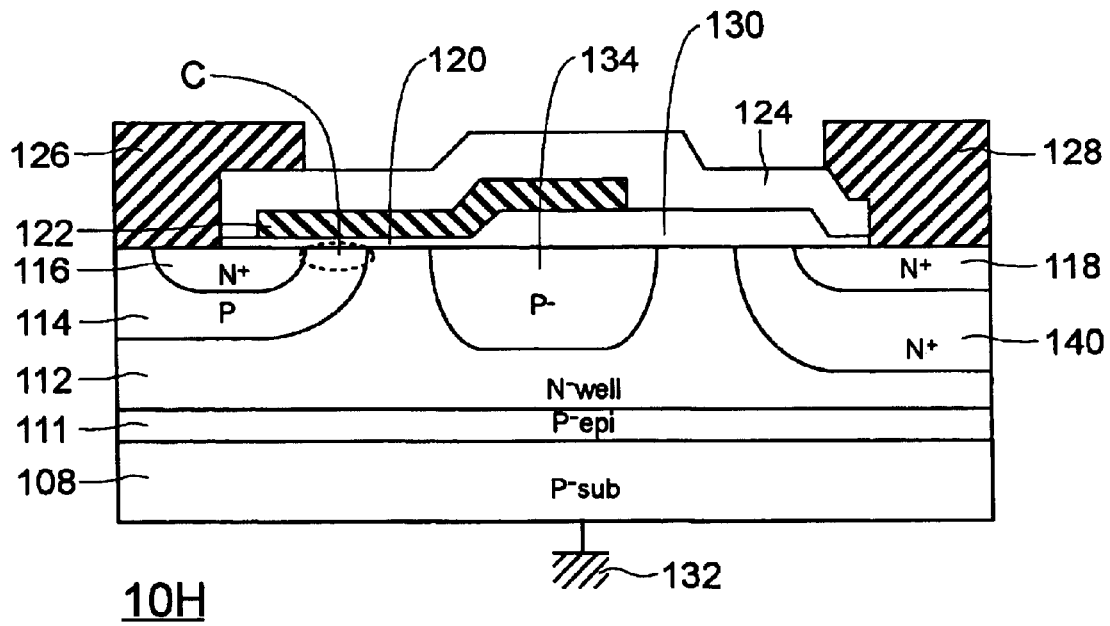
FIG. 11 is a cross-sectional view of a lateral short-channel DMOS according to Embodiment 8.

FIG. 11 is a cross-sectional view of a lateral short-channel DMOS according to Embodiment 8. A lateral short-channel DMOS 10H according to Embodiment 8 has a similar structure to the lateral short-channel DMOS 10F according to Embodiment 6, but differs as shown in FIG. 11 in that the N⁻-type well 112 is not formed in an N⁻-type epitaxial layer 110 formed on the surface of the P⁻-type semiconductor substrate 108 but is instead formed in a P⁻-type epitaxial layer 111 formed on the surface of the P⁻-type semiconductor substrate 108.

In this way, in the lateral short-channel DMOS 10H according to Embodiment 8, the P⁻-type epitaxial layer 111 is formed on the surface of the P⁻-type semiconductor substrate 108, but the N⁻-type well 112 is formed in the surface of this P⁻-type epitaxial layer 111, the P-type well 114 including the channel forming region C is formed in the surface of the N⁻-type well 112, and the N⁺-type source region 116 is formed in the surface of this P-type well 114. On the other hand, the N⁺-type well 140 is formed in the surface of the N⁻-type well 112 and the N⁺-type drain region 118 is formed in the surface of the N⁺-type well 140.

This means that the lateral short-channel DMOS 10H according to Embodiment 8 has the same effects as the lateral short-channel DMOS 10F according to Embodiment 6.

It should be noted that the lateral short-channel DMOS 10H according to Embodiment 8 is an N-channel lateral short-channel DMOS, and that in the same way as with the lateral short-channel DMOS 10A according to Embodiment 1, when used for high-side switching, the DMOS 10H functions as a so-called RESURF-type lateral short-channel DMOS in which the substrate surface becomes almost completely depleted when the DMOS 10H is off (that is, during reverse bias).

Embodiment 9

Figure 12:
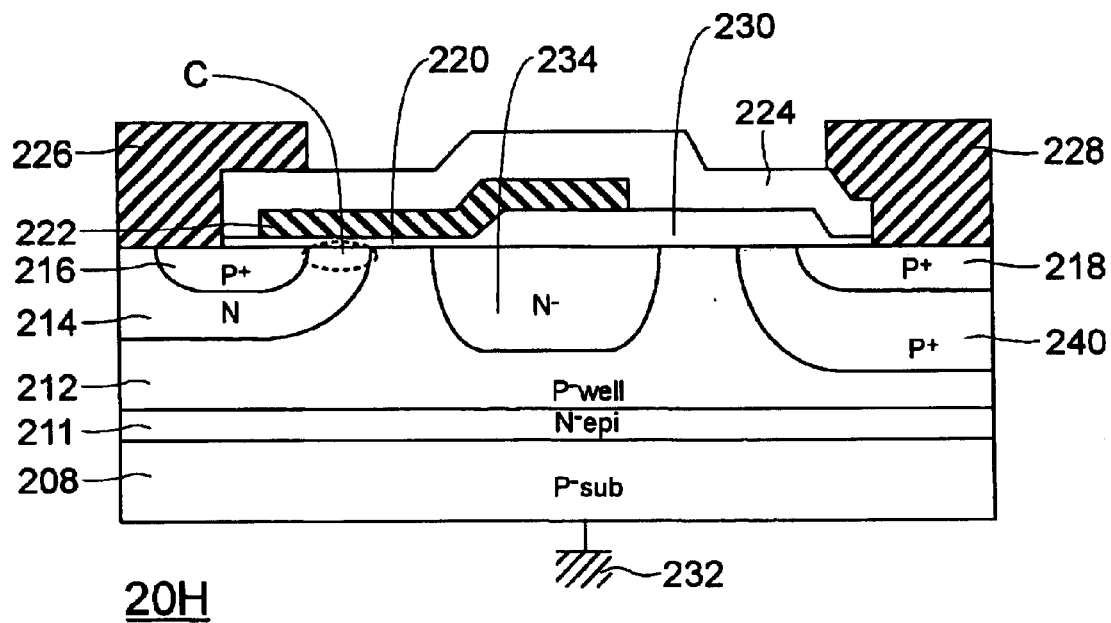
FIG. 12 is a cross-sectional view of a lateral short-channel DMOS according to Embodiment 9.

FIG. 12 is a cross-sectional view of a lateral short-channel DMOS according to Embodiment 9 of the present invention. The lateral short-channel DMOS 20H according to Embodiment 9 is the lateral short-channel DMOS 10H according to Embodiment 8 with the conductivity types (except that of the semiconductor substrate) having been reversed. The lateral short-channel DMOS 20H according to Embodiment 9 differs to the lateral short-channel DMOS 10H according to Embodiment 8 by being a P-channel-type lateral short-channel DMOS, but when used for high-side switching, the DMOS 20H functions as a so-called RESURF-type lateral short-channel DMOS in which the substrate surface becomes almost completely depleted when the DMOS 20H is off (that is, during reverse bias).

This means that the lateral short-channel DMOS 20H according to Embodiment 9 can obtain the same effects as the lateral short-channel DMOS 10H.

Embodiment 10

Figures 1, 13A:
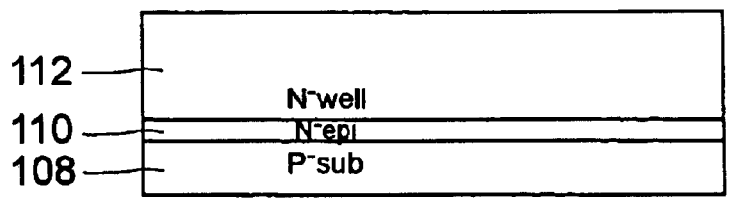
Figures 2, 13A:
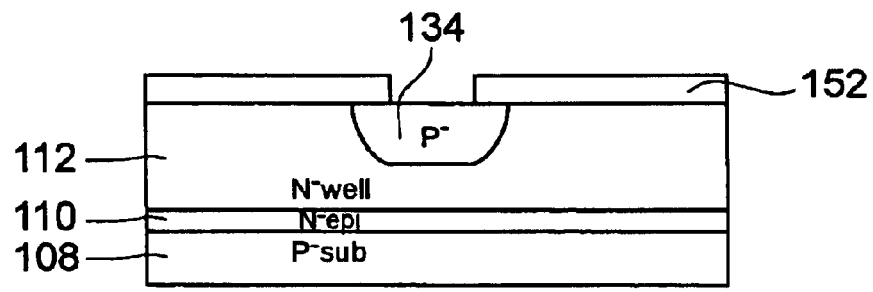
Figure 13B:
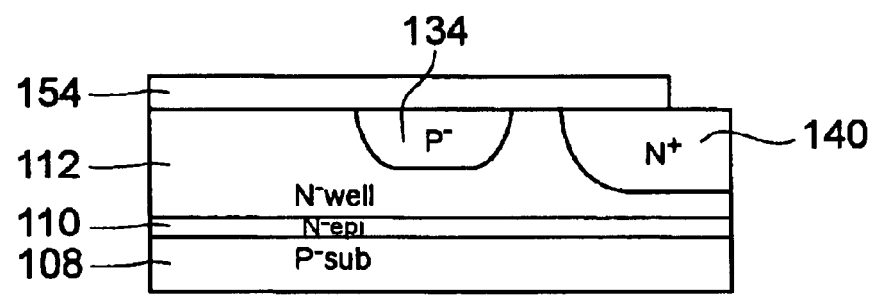
FIG. 13$a$-1 to FIG. 13$g$ are a series of diagrams showing manufacturing steps in a method of manufacturing a lateral short-channel DMOS according to Embodiment 10.
Figure 13C:
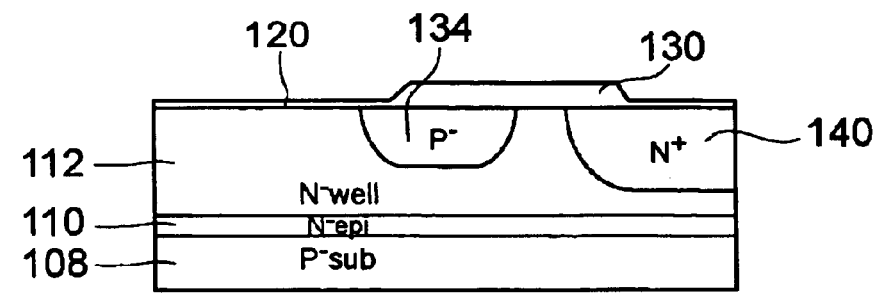
Figure 13D:
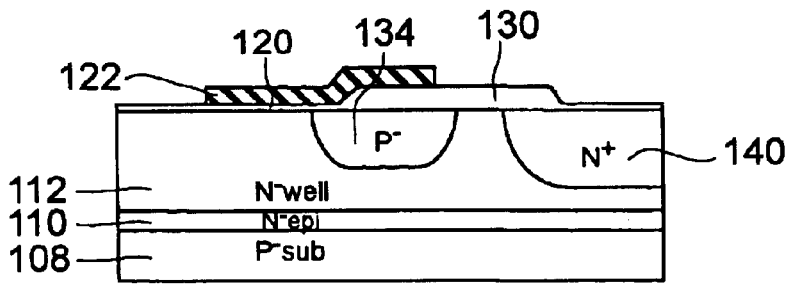
Figure 13E:
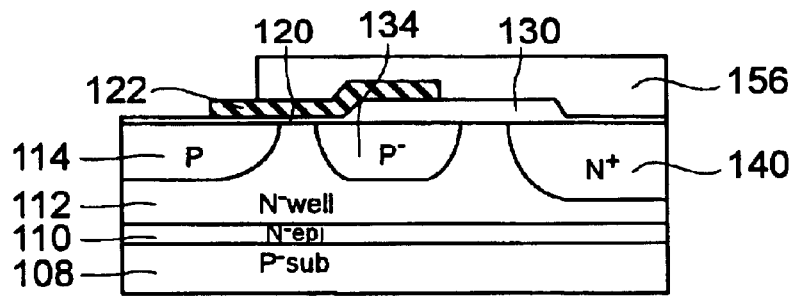
Figure 13F:
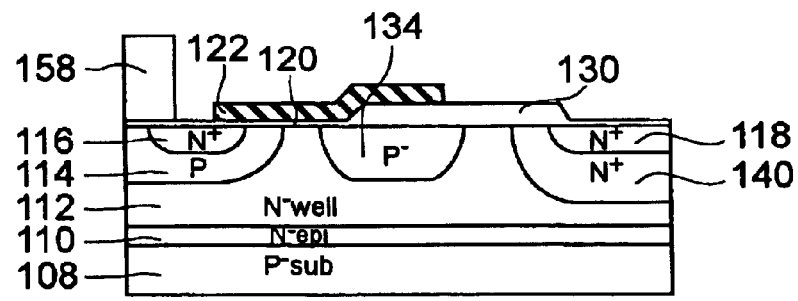
Figure 13G:
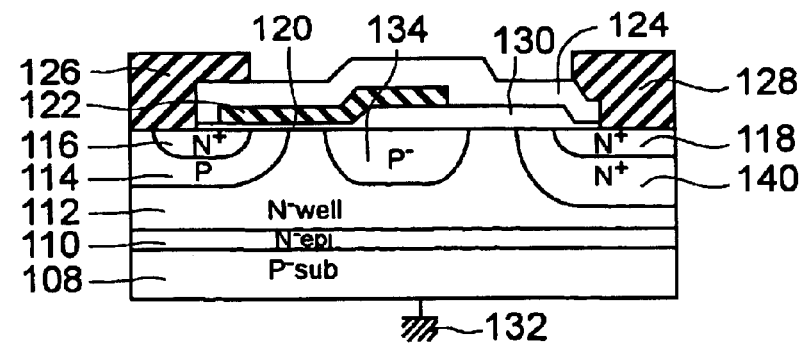
Figure 14:
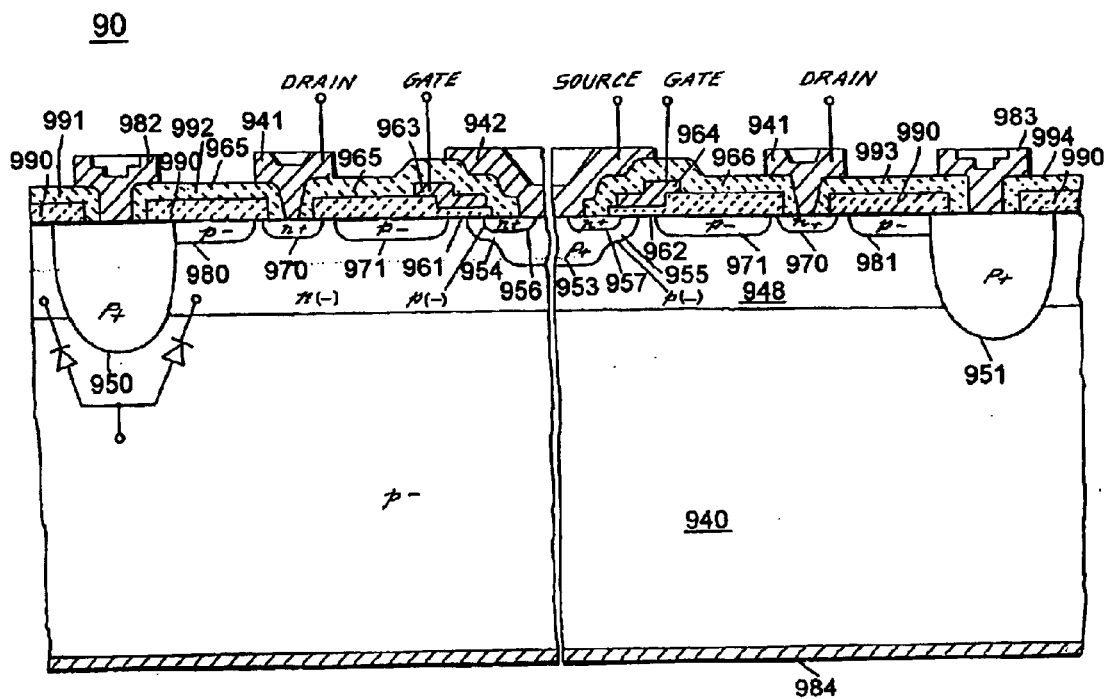
FIG. 14 is a cross-sectional view of a conventional lateral short-channel DMOS.
Figure 15:
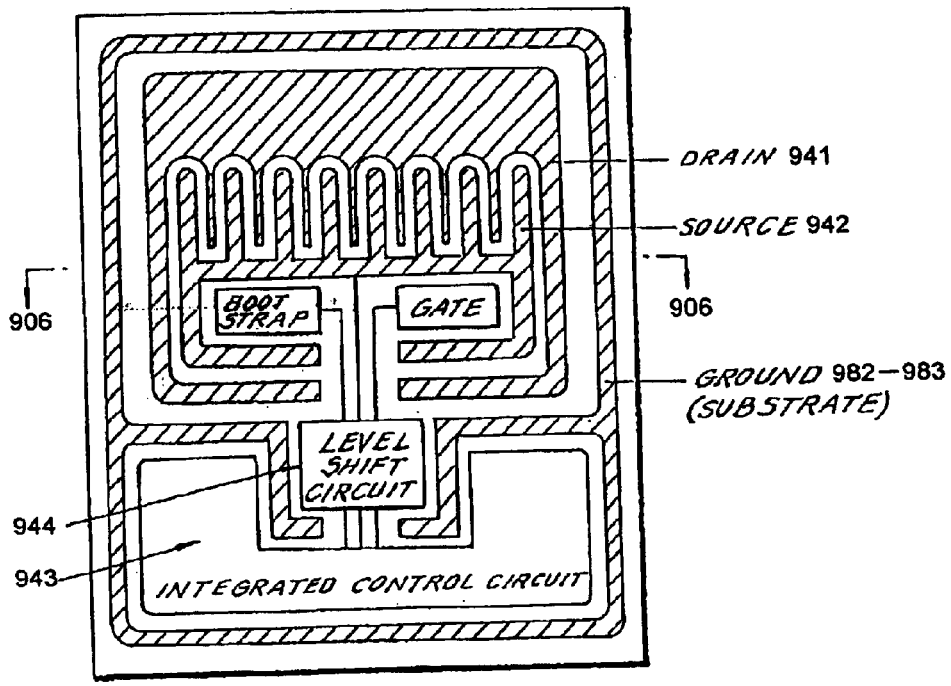
FIG. 15 is a plan view of a conventional lateral short-channel DMOS.

FIGS. 13a-1 to 13g are diagrams showing the manufacturing processes during a "method of manufacturing a lateral short-channel DMOS" according to Embodiment 10. The "method of manufacturing a lateral short-channel DMOS" according to Embodiment 10 is a method of manufacturing a lateral short-channel DMOS 10F according to Embodiment 6. The "method of manufacturing a lateral short-channel DMOS" according to Embodiment 10 will now be described with reference to FIGS. 13a-1 to 13g.

As shown in FIGS. 13a-1 to 13g, the method of manufacturing a lateral short-channel DMOS according to Embodiment 10 includes a (a-1) first process (part one) to a (g) seventh process described below.

(a-1) First Process (Part One)

A P⁻-type silicon substrate 108 having an N⁻-type epitaxial layer 110 on one surface is prepared. Arsenic ions, for example, are then implanted as an N-type dopant into the surface of the N⁻-type epitaxial layer 110 to form the N⁻-type well 112 (see FIG. 13a-1). The dopant concentration of the P⁻-type silicon substrate 108 is $3\times10^{+16}$ ions/cm³, for example, a substrate that is 600 μm thick, for example, is used, the dopant concentration of the N⁻-type epitaxial layer 110 is $5\times10^{+14}$ ions/cm³, for example, and a thickness of 10 μm, for example, is used. The N⁻-type well 112 is formed with a surface dopant concentration of $1\times10^{+16}$ ions/cm³, for example, and a depth of 6 μm, for example.

(a-2) First Process (Part Two)

A fourth ion implanting mask 152 with a predetermined opening is formed in the surface of the N⁻⁻-type well 112 and boron ions, for example, are implanted as a P-type dopant with the fourth ion implanting mask 152 as a mask to form a P⁻-type diffused region 134 (FIG. 13a-2). At this time, the P⁻-type diffused region 134 is formed with a surface dopant concentration of $3\times10^{+16}$ ions/cm³, for example, and a depth of 2.5 μm, for example.

(b) Second Process

Next, after the fourth ion implanting mask 152 has been removed, a first ion implanting mask 154 with a predetermined opening is formed on the surface of the N⁻-type well 112 and phosphorus ions, for example, are implanted as an N-type dopant with the first ion implanting mask 154 as a mask to form the N⁺-type well 140 (see FIG. 13b). Here, the N⁺-type well 140 is formed with a surface dopant concentration of $2\times10^{+19}$ ions/cm³, for example, and a depth of 4 μm, for example.

(c) Third Process

Next, after the first ion implanting mask 154 has been removed, the field oxide film 130 with a predetermined opening is formed on the surface of the N⁻-type well 112, and by thermally oxidizing the opening in the field oxide film 130, the gate insulating film 120 is formed (see FIG. 13c). At this time, the field oxide film 130 is formed with a thickness of 1000 nm or less and the gate insulating film 120 is formed with a thickness of 100 nm or less.

(d) Fourth Process

The gate electrode 122 is formed in a predetermined region on the gate insulating film 120 and the field oxide film 130 (see FIG. 13d). Polysilicon, for example, can be used as the material of the gate electrode.

(e) Fifth Process

A second ion implanting mask 156 with a predetermined opening is formed on the surface of the N⁻-type well 112 and boron ions, for example, are implanted as a P-type dopant with the second ion implanting mask 156 and the gate electrode 122 as a mask to form the P-type well 114 (FIG. 13e). At this time, the P-type well 114 is formed with a surface dopant concentration of $5\times10^{+17}$ ions/cm³, for example, and a depth of 1 μm, for example.

(f) Sixth Process

Next, after the second ion implanting mask 156 has been removed, a third ion implanting mask 158 with a predetermined opening is formed on the surface of the N⁻-type well 112 and arsenic ions, for example, are implanted as an N-type dopant with the third ion implanting mask 158, the gate electrode 122, and the field oxide film 130 as a mask to form the N⁺-type source region 116 and the N⁺-type drain region 118 (see FIG. 13f). At this time, the N⁺-type source region 116 and the N⁺-type drain region 118 are formed with a surface dopant concentration of $1\times10^{+20}$ ions/cm³, for example, and a depth of 0.3 μm, for example.

(g) Seventh Process

After the third ion implanting mask 158 has been removed, an interlayer dielectric film 124 is formed, a predetermined contact hole is opened in this interlayer dielectric film 124, and electrodes 126, 128 are then formed of metal layers on the interlayer dielectric film 124 (see FIG. 13g). At this time, the interlayer dielectric film 124 is made at least 1000 nm thick.

As described above, according to the method of manufacturing a lateral short-channel DMOS according to Embodiment 10, it is possible to manufacture the lateral short-channel DMOS 10F according to Embodiment 6 that has high breakdown characteristics and superior current driving characteristics using a relatively simple method.

It should be noted that in the method of manufacturing a lateral short-channel DMOS according to Embodiment 10, in the (e) fifth process to the (f) sixth process, the P-type well 114 and the N$^+$-type source region 116 are formed in a self align technology using the gate electrode 122, but the lateral short-channel DMOS according to the present invention can also be formed by not forming the P-type well 114 and the N$^+$-type source region 116 in a self align technology, that is, the P-type well 114 can be formed by implanting ions with a separately formed ion implanting mask as a mask and the N$^+$-type source region 116 can be formed by implanting ions using the gate electrode 122.

It should be noted that in Embodiment 10, a method of manufacturing the lateral short-channel DMOS 10F according to Embodiment 6 has been described, but when the lateral short-channel DMOS 10G according to Embodiment 7 is manufactured, between the (a-2) first process (part two) and the (b) second process of the method of manufacturing a lateral short-channel DMOS according to Embodiment 10, after the fourth ion implanting mask 152 has been removed, a fifth ion implanting mask with a predetermined opening is formed in the surface of the N$^-$-type well 112 and phosphorous ions, for example, as an N-type dopant are implanted with the fifth ion implanting mask as a mask to form the N$^-$-type diffused region 136. At this time, the N$^-$-type diffused region 136 is formed with a surface dopant concentration of $6 \times 10^{+16}$ ions/cm$^3$, for example, and a depth of 0.5 μm, for example.

Also, when manufacturing the lateral short-channel DMOS 10A according to Embodiment 1, in the (a-1) first process (part one) of the method of manufacturing a lateral short-channel DMOS according to Embodiment 10, the P$^-$-type silicon substrate 108 that has the N$^-$-type epitaxial layer 110 on one surface is prepared and a lateral short-channel DMOS is formed with the N$^-$-type epitaxial layer 110 being used as it is (that is, no N$^-$-type well 112 is formed). The dopant concentration of the P$^-$-type silicon substrate 108 at this time is $3 \times 10^{+16}$ ions/cm$^3$, for example, a substrate that is 600 μm thick, for example is used, the dopant concentration of the N$^-$-type epitaxial layer 110 is $1 \times 10^{+16}$ ions/cm$^3$, for example, and a thickness of 10 μm, for example, is used.

Also, when manufacturing the lateral short-channel DMOS 10B according to Embodiment 2, in between the (a-2) first process (part two) and the (b) second process out of the processes used when manufacturing the lateral short-channel DMOS 10A according to Embodiment 1, after the fourth ion implanting mask 152 has been removed, a fifth ion implanting mask with a predetermined opening is formed on the surface of the N$^-$-type well 112 and a first process (part three) is then carried out to form the N$^-$-type well 136 by implanting phosphorous ions, for example, as an N-type dopant with the fifth ion implanting mask as a mask. At this time, the surface dopant concentration of the N$^-$-type diffused region 136 is $6 \times 10^{+16}$ ions/cm$^3$, for example, and the dopant is diffused to a depth of 0.5 μm, for example.

Also, when manufacturing the lateral short-channel DMOS 10C according to Embodiment 3, in the processes used when manufacturing the lateral short-channel DMOS 10B according to Embodiment 2, a mask whose opening reaches the N$^+$-type well 140 is used as the fifth ion implanting mask in the first process (part three).

Also, when manufacturing the lateral short-channel DMOS 10D according to Embodiment 4, a process that forms the second P$^+$-type diffused region 142 is added to the processes used when manufacturing the lateral short-channel DMOS 10A according to Embodiment 1.

Also, when manufacturing the lateral short-channel DMOS 10E according to Embodiment 5, a process that forms the third P$^+$-type diffused region 144 is added to the processes used when manufacturing the lateral short-channel DMOS 10A according to Embodiment 1.

Also, when manufacturing the lateral short-channel DMOS 10H according to Embodiment 8, the (a-1) first process (part one) in the method of manufacturing a lateral short-channel DMOS according to Embodiment 10 is replaced with the process described below, and after this process, the same processes are carried out as in Embodiment 10.

(a-1) First Process (Part One)

A P$^-$-type silicon substrate 108 having a P$^-$-type epitaxial layer 111 on one surface is prepared. Arsenic ions, for example, as an N-type dopant are then implanted into the surface of the P$^-$-type epitaxial layer 111 to form the N$^-$-type well 112. The dopant concentration of the P$^-$-type silicon substrate 108 is $3 \times 10^{+16}$ ions/cm$^3$, for example, and a substrate that is 600 μm thick, for example, is used, the dopant concentration of the P$^-$-type epitaxial layer 111 is $5 \times 10^{+14}$ ions/cm$^3$, for example, and a thickness of 10 μm, for example, is used. The N$^-$-type well 112 is formed with a surface dopant concentration of $1 \times 10^{+16}$ ions/cm$^3$, for example, and a depth of 6 μm, for example.

Also, when manufacturing the lateral short-channel DMOS 20H according to Embodiment 9, the (a-1) first process (part one) in the method of manufacturing a lateral short-channel DMOS according to Embodiment 10 is replaced with the process described below, and after this process, the same processes are carried out as in Embodiment 10 but with reversed conductivity types.

(a-1) First Process (Part One)

A P$^-$-type silicon substrate 208 having an N$^-$-type epitaxial layer 211 on one surface is prepared. Boron ions, for example, as a P-type dopant are then implanted into the surface of the N$^-$-type epitaxial layer 211 to form the P$^-$-type well 212. The dopant concentration of the P$^-$-type silicon substrate 208 is $3 \times 10^{+16}$ ions/cm$^3$, for example, a substrate that is 600 μm thick, for example, is used, the dopant concentration of the N$^-$-type epitaxial layer 211 is $5 \times 10^{+14}$ ions/cm$^3$, for example, and a thickness of 10 μm, for example, is used. The P$^-$-type well 212 is formed with a surface dopant concentration of $1 \times 10^{+16}$ ions/cm$^3$, for example, and a depth of 6 μm, for example.

As described above, according to the present invention, it is possible to reduce ON resistance while achieving high breakdown characteristics, so that a lateral short-channel DMOS with high breakdown characteristics and superior current driving characteristics can be provided. Also, according to the present invention, it is possible to manufacture this kind of superior lateral short-channel DMOS relatively easily.

What is claimed is:

1. A lateral short-channel DMOS in which a first conductivity-type semiconductor region is formed, a surface of the first conductivity-type semiconductor region becoming almost completely depleted during reverse bias, the lateral short-channel DMOS comprising:

the first conductivity-type semiconductor region formed in one surface of a semiconductor substrate;

a second conductivity-type well formed in a surface of the first conductivity-type semiconductor region and includes a channel forming region;

a first conductivity-type source region formed in a surface of the second conductivity-type well;

a first conductivity-type drain region formed in the surface of the first conductivity-type semiconductor region;

a gate electrode that is formed via a gate insulating film in an upper part of at least the channel forming region out of a region from the first conductivity-type source region to the first conductivity-type drain region;

a first conductivity-type well formed in the surface of the first conductivity-type semiconductor region and including a concentration of first conductivity-type dopant higher than that of the first conductivity-type semiconductor region and lower than that of the first conductivity-type drain region, wherein the first conductivity-type drain region is formed in a surface of the first conductivity-type well; and a second conductivity-type diffused region that is formed in a region of the surface of the first conductivity-type semiconductor region between the first conductivity-type well and the second conductivity-type well in a floating state so as not to contact the first conductivity-type well and the second conductivity-type well.

2. The lateral short-channel DMOS according to claim 1, wherein the concentration of first conductivity-type dopant included in the first conductivity-type well is in a range of $1 \times 10^{+18}$ ions/cm$^3$ to $3 \times 10^{+20}$ ions/cm$^3$.

3. The lateral short-channel DMOS according to claim 1, wherein the first conductivity-type well is formed with a depth of at least 2 μm.

4. A semiconductor device including the lateral short-channel DMOS according to claim 1.

5. The lateral short-channel DMOS according to claim 1, wherein, in a region from the channel forming region to the second conductivity-type diffused region, the gate electrode is provided opposite the first conductivity-type semiconductor region with the gate insulating film in between, and in part of a region from the second conductivity-type diffused region to the first conductivity-type drain region, the gate electrode is provided opposite the first conductivity-type semiconductor region with a field oxide film in between, and a stepped part of the gate electrode is formed above the second conductivity-type diffused region.

6. The lateral short-channel DMOS according to claim 1, further comprising a first conductivity-type diffused region which has a concentration of first conductivity-type dopant higher than that of the first conductivity-type semiconductor region and is formed on a first conductivity-type semiconductor region surface side of the second conductivity-type diffused region.

7. The lateral short-channel DMOS according to claim 6, wherein the first conductivity-type diffused region contacts the first conductivity-type well.

8. The lateral short-channel DMOS according to claim 1, further comprising:

another second conductivity-type diffused region in a region inside the second conductivity-type well in a planar direction of the first conductivity-type semiconductor region, said another second conductivity-type diffused region including a concentration of second conductivity-type dopant higher than that of the second conductivity-type well and having a depth of diffusion deeper than that of the second conductivity-type well.

9. The lateral short-channel DMOS according to claim 1, further comprising:

a further second conductivity-type diffused region in a region inside the second conductivity-type well in a planar direction of the first conductivity-type semiconductor region, the further second conductivity-type diffused region including a concentration of second conductivity-type dopant higher than that of the second conductivity-type well and having a depth of diffusion that reaches the semiconductor substrate.

10. The lateral short-channel DMOS according to claim 1, further comprising:

a source electrode connected to the first conductivity-type source region; and a drain electrode connected to the first conductivity-type drain region;

wherein the lateral short-channel DMOS has a planar structure where the drain electrode is enclosed within the gate electrode and the gate electrode is enclosed within the source electrode.

11. The lateral short-channel DMOS according to claim 1, wherein the first conductivity-type semiconductor region is a first conductivity-type well formed in a surface of an epitaxial layer formed on the semiconductor substrate.

12. The lateral short-channel DMOS according to claim 1, wherein the first conductivity-type semiconductor region is a first conductivity-type epitaxial layer formed on the semiconductor substrate.

13. A method of manufacturing a lateral short-channel DMOS in which a first conductivity-type semiconductor region is formed, a surface of the first conductivity-type semiconductor region becoming almost completely depleted during reverse bias, the lateral short-channel DMOS comprising:

the first conductivity-type semiconductor region formed in one surface of a semiconductor substrate;

a second conductivity-type well formed in a surface of the first conductivity-type semiconductor region and includes a channel forming region;

a first conductivity-type source region formed in a surface of the second conductivity-type well;

a first conductivity-type drain region formed in the surface of the first conductivity-type semiconductor region;

a gate electrode that is formed via a gate insulating film in an upper part of at least the channel forming region out of a region from the first conductivity-type source region to the first conductivity-type drain region; and a first conductivity-type well formed in the surface of the first conductivity-type semiconductor region and including a concentration of first conductivity-type dopant higher than that of the first conductivity-type semiconductor region and lower than that of the first conductivity-type drain region, wherein the first conductivity-type drain region is formed in a surface of the first conductivity-type well;

said method comprising the following steps in order:

(a) a first step of preparing the semiconductor substrate on whose surface the first conductivity-type semiconductor region has been formed;

(b) a second step of forming a first ion implanting mask with a predetermined opening on a surface of the first conductivity-type semiconductor region and implanting a first conductivity-type dopant with the first ion implanting mask as a mask to form the first conductivity-type well;

(c) a third step of forming, after the first ion implanting mask has been removed, a field oxide film with a predetermined opening on the surface of the first conductivity-type semiconductor region, and forming the gate insulating film by thermal oxidization at the opening of the field oxide film;

(d) a fourth step of forming the gate electrode in a predetermined region on the gate insulating film and the field oxide film;

(e) a fifth step of forming a second ion implanting mask with a predetermined opening on the surface of the first conductivity-type semiconductor region and implanting second conductivity-type dopant with the second ion implanting mask and the gate electrode as mask to form the second conductivity-type well;

(f) a sixth step of forming, after the second ion implanting mask has been removed, a third ion implanting mask with a predetermined opening on the surface of the first conductivity-type semiconductor region and implanting first conductivity-type dopant with at least the third ion implanting mask and the gate electrode as a mask to form the first conductivity-type source region and the first conductivity-type drain region; and (g) a seventh step of forming, after the third ion implanting mask has been removed, an interlayer dielectric film, opening a predetermined contact hole in the interlayer dielectric film, and then forming electrodes of a metal layer on the interlayer dielectric film.

14. The method of claim 13, further comprising:

between the first step and the second step, a step of forming a fourth ion implanting mask with a predetermined opening on the surface of the first conductivity-type semiconductor region and implanting a second conductivity-type dopant with the fourth ion implanting mask as a mask to form a second conductivity-type diffused region.

15. A lateral short-channel DMOS in which a first conductivity-type semiconductor region is formed, a surface of the first conductivity-type semiconductor region becoming almost completely depleted during reverse bias, the lateral short-channel DMOS comprising:

the first conductivity-type semiconductor region formed in one surface of a semiconductor substrate;

a second conductivity-type well formed in a surface of the first conductivity-type semiconductor region and includes a channel forming region;

a first conductivity-type source region formed in a surface of the second conductivity-type well;

a first conductivity-type drain region formed in the surface of the first conductivity-type semiconductor region;

a gate electrode that is formed via a gate insulating film in an upper part of at least the channel forming region out of a region from the first conductivity-type source region to the first conductivity-type drain region;

a first conductivity-type well formed in the surface of the first conductivity-type semiconductor region and including a concentration of first conductivity-type dopant higher than that of the first conductivity-type semiconductor region and lower than that of the first conductivity-type drain region, wherein the first conductivity-type drain region is formed in a surface of the first conductivity-type well; and a second conductivity-type diffused region in a region inside the second conductivity-type well in a planar direction of the first conductivity-type semiconductor region, said second conductivity-type diffused region including a concentration of second conductivity-type dopant higher than that of the second conductivity-type well and having a depth of diffusion deeper than that of the second conductivity-type well.

16. The lateral short-channel DMOS according to claim 15, wherein the depth of diffusion of said second conductivity-type diffused region is sufficient to reach the semiconductor substrate.

* * * * *

UNITED STATES PATENT AND TRADEMARK OFFICE
CERTIFICATE OF CORRECTION

PATENT NO. : 6,946,705 B2 Page 1 of 1
APPLICATION NO. : 10/491140
DATED : September 20, 2005
INVENTOR(S) : Makoto Kitaguchi It is certified that error appears in the above-identified patent and that said Letters Patent is hereby corrected as shown below:

Column 15, line 53 "well 112"  should be --epitaxial layer 110--.

Column 15, line 55 "well"  should be --diffused region--.

Signed and Sealed this

Twenty-second Day of May, 2007

JON W. DUDAS
*Director of the United States Patent and Trademark Office*